US008977989B2

(12) United States Patent
Cote et al.

(10) Patent No.: US 8,977,989 B2
(45) Date of Patent: *Mar. 10, 2015

(54) HANDLING OF FLAT DATA FOR PHASE PROCESSING INCLUDING GROWING SHAPES WITHIN BINS TO IDENTIFY CLUSTERS

(75) Inventors: Michel L. Cote, San Jose, CA (US); Christophe Pierrat, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 1511 days.

This patent is subject to a terminal disclaimer.

(21) Appl. No.: 12/352,538

(22) Filed: Jan. 12, 2009

(65) Prior Publication Data

US 2009/0125867 A1    May 14, 2009

Related U.S. Application Data

(60) Division of application No. 11/083,697, filed on Mar. 17, 2005, now Pat. No. 7,500,217, and a continuation of application No. 10/165,550, filed on Jun. 7, 2002, now Pat. No. 6,978,436, and a continuation-in-part of (Continued)

(51) Int. Cl.
   *G06F 17/50*   (2006.01)
   *G03F 1/30*    (2012.01)
(52) U.S. Cl.
   CPC .................. *G03F 1/30* (2013.01)
   USPC .................. 716/54; 716/50; 716/51
(58) Field of Classification Search
   USPC .......................................... 716/50
   See application file for complete search history.

(56) References Cited

U.S. PATENT DOCUMENTS

| 4,037,918 A | 7/1977 | Kato |
| 5,182,718 A | 1/1993 | Harafuji et al. ............. 364/490 |

(Continued)

FOREIGN PATENT DOCUMENTS

| DE | 195 45 163 A1 | 6/1996 |
| EP | 0 653 679 A2  | 5/1995 |

(Continued)

OTHER PUBLICATIONS

Ackmann, P., et al., "Phase Shifting and Optical Proximity Corrections to Improve CD Control on Logic Devices in Manufacturing for Sub 0.35 um I-Line", SPIE, vol. 3051, pp. 146-153, Mar. 12-14, 1997.

(Continued)

*Primary Examiner* — Jack Chiang
*Assistant Examiner* — Bryce Aisaka
(74) *Attorney, Agent, or Firm* — Bever, Hoffman & Harms, LLP

(57) ABSTRACT

Definition of a phase shifting layout from an original layout can be time consuming. If the original layout is divided into useful groups, i.e. clusters that can be independently processed, then the phase shifting process can be performed more rapidly. If the shapes on the layout are enlarged, then the overlapping shapes can be grouped together to identify shapes that should be processed together. For large layouts, growing and grouping the shapes can be time consuming. Therefore, an approach that uses bins can speed up the clustering process, thereby allowing the phase shifting to be performed in parallel on multiple computers. Additional efficiencies result if identical clusters are identified and processing time saved so that repeated clusters of shapes only undergo the computationally expensive phase shifter placement and assignment process a single time.

16 Claims, 5 Drawing Sheets

Related U.S. Application Data application No. 10/085,759, filed on Feb. 28, 2002, now Pat. No. 6,787,271, and a continuation-in-part of application No. 09/669,359, filed on Sep. 26, 2000, now Pat. No. 6,503,666.

(60) Provisional application No. 60/296,788, filed on Jun. 8, 2001, provisional application No. 60/304,142, filed on Jul. 10, 2001, provisional application No. 60/325,689, filed on Sep. 28, 2001, provisional application No. 60/215,938, filed on Jul. 5, 2000.

(56) References Cited

U.S. PATENT DOCUMENTS

| | | | |
|---|---|---|---|
| 5,302,477 A | 4/1994 | Dao et al. | 430/5 |
| 5,308,741 A | 5/1994 | Kemp | 430/312 |
| 5,324,600 A | 6/1994 | Jinbo et al. | 430/5 |
| 5,364,716 A | 11/1994 | Nakagawa et al. | 430/5 |
| 5,432,714 A | 7/1995 | Chung et al. | 364/525 |
| 5,441,834 A | 8/1995 | Takekuma et al. | |
| 5,472,814 A | 12/1995 | Lin | 430/5 |
| 5,523,186 A | 6/1996 | Lin et al. | 430/5 |
| 5,527,645 A | 6/1996 | Pati et al. | 430/5 |
| 5,533,148 A | 7/1996 | Sayah et al. | 382/240 |
| 5,537,648 A | 7/1996 | Liebmann et al. | 395/500 |
| 5,538,815 A | 7/1996 | Oi et al. | 430/5 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,657,235 A | 8/1997 | Liebmann et al. | 364/474.24 |
| 5,682,323 A | 10/1997 | Pasch et al. | 364/491 |
| 5,686,223 A | 11/1997 | Cleeves | |
| 5,702,848 A | 12/1997 | Spence | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,786,112 A | 7/1998 | Okamoto et al. | |
| 5,807,649 A | 9/1998 | Liebmann et al. | 430/5 |
| 5,858,580 A | 1/1999 | Wang et al. | 430/5 |
| 5,885,734 A | 3/1999 | Pierrat et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,009,250 A | 12/1999 | Ho et al. | 395/500.06 |
| 6,009,251 A | 12/1999 | Ho et al. | 395/500.06 |
| 6,011,911 A | 1/2000 | Ho et al. | 395/500.06 |
| 6,057,063 A | 5/2000 | Liebmann et al. | 430/5 |
| 6,064,806 A | 5/2000 | Lakos et al. | 395/500.04 |
| 6,066,180 A | 5/2000 | Kim et al. | 716/19 |
| 6,077,310 A | 6/2000 | Yamamoto et al. | 716/19 |
| 6,081,658 A | 6/2000 | Rieger et al. | 395/500.22 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,238,824 B1 | 5/2001 | Futrell et al. | |
| 6,251,549 B1 | 6/2001 | Levenson | 430/11 |
| 6,258,493 B1 | 7/2001 | Wang et al. | 430/5 |
| 6,303,251 B1 * | 10/2001 | Mukai et al. | 430/5 |
| 6,316,163 B1 | 11/2001 | Magoshi et al. | |
| 6,335,128 B1 | 1/2002 | Cobb et al. | 430/5 |
| 6,338,922 B1 | 1/2002 | Liebmann et al. | 430/5 |
| 6,339,836 B1 | 1/2002 | Eisenhofer et al. | 716/5 |
| 6,370,679 B1 | 4/2002 | Chang et al. | 716/19 |
| 6,415,421 B2 | 7/2002 | Anderson et al. | |
| 6,416,907 B1 | 7/2002 | Winder et al. | |
| 6,420,074 B2 | 7/2002 | Wang et al. | 430/5 |
| 6,436,590 B2 | 8/2002 | Wang et al. | 430/5 |
| 6,453,452 B1 | 9/2002 | Chang et al. | 716/8 |
| 6,467,076 B1 | 10/2002 | Cobb | |
| 6,470,489 B1 | 10/2002 | Chang et al. | |
| 6,492,073 B1 | 12/2002 | Lin et al. | |
| 6,610,449 B2 | 8/2003 | Pierrat | |
| 6,901,575 B2 | 5/2005 | Wu et al. | |
| 6,978,436 B2 * | 12/2005 | Cote et al. | 716/55 |
| 7,017,141 B2 | 3/2006 | Anderson et al. | |
| 2001/0000240 A1 | 4/2001 | Wang et al. | 430/5 |
| 2001/0028985 A1 | 10/2001 | Wang et al. | 430/5 |
| 2001/0052107 A1 * | 12/2001 | Anderson et al. | 716/4 |
| 2002/0006562 A1 * | 1/2002 | Akutagawa et al. | 430/30 |
| 2002/0127479 A1 | 9/2002 | Pierrat | 430/5 |
| 2002/0129327 A1 | 9/2002 | Pierrat et al. | 716/19 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| GB | 2333613 A | 7/1999 |
| JP | 62067547 | 3/1987 |
| JP | 2-140743 | 5/1990 |
| JP | 1283925 | 2/1991 |
| JP | 3-80525 | 4/1991 |
| JP | 6-67403 | 3/1994 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 97/38381 | 10/1997 |
| WO | WO 98/12605 A1 | 3/1998 |
| WO | WO 99/14636 A1 | 3/1999 |
| WO | WO 99/14637 A1 | 3/1999 |
| WO | WO 99/14638 A1 | 3/1999 |
| WO | WO 01/23961 A1 | 4/2001 |
| WO | WO 02/03140 A1 | 1/2002 |

OTHER PUBLICATIONS

Lithas, "Lithas: Optical Proximity Correction Software" (2 pages).
Matsuoka, K., et al., "Application of Alternating Phase-Shifting Mask to 0.16um CMOS Logic Gate Patterns", Marsushira Electric Ind. Co., Ltd. (9 pages).
Rieger, M., et al., "Using Behavior Modeling for Proximity Correction", Precim Company, Portland, Oregon (6 pages).
Wang, R., et al., "Plarized Phase Shift Mask: Concept, Design, and Potential Advantages to Photolithography Process and Physical Design", Motorola Semiconductor Product Sector (12 pages).
Ogawa, K., et al., "Phase Defect Inspection by Differential Interference", Lasertec Corporation (12 pages).
Pistor, T, "Rigorous 3D Simulation of Phase Defects in Alternating Phase-Shifting Masks", Panoramic Technology Inc. (13 pages).
Semmier, A., et al., "Application of 3D EMF Simulation for Development and Optimization of Alternating Phase Shifting Masks", Infineon Technologies AG (12 pages).
Wong, A., et al., "Polarization Effects in Mask Transmission", University of California Berkeley (8 pages).
Erdmann, A., "Topography Effects and Wave Aberrations in Advanced PSM-Technology", Fraunhofer Institute of Integrated Circuits (11 pages).
Granik, Y., et al., "CD Variation Analysis Technique and its Application to the Study of PSM Mask Misalignment", Mentor Graphics (9 pages).
Hanyu, et al., "New Phase-Shifting Mask with Highly Transparent SiO2 Phase Shifters", Fujitsu Laboratories Ltd. (11 pages).
Ishiwata N., et al., "Fabrication of Phase-Shifting Mask" Fujitsu Limited (11 pages).
Levenson, M., et al., "Phase Phirst! An Improved Strong-PSM Paradigm", M.D. Levenson Consulting. Petersen Advanced Lithography. KLA-Tencor ( 10 pages).
Levenson, M., et al., "SCAA Mask Exposures and Phase Phirst Design for 110nm and Below", M.D. Levenson Consulting, Canon USA, Inc., JSR Microelectronics, Inc. (10 pages).
Lin, B.J., "The Relative Importance of the Building Blocks for 193nm Optical Lithography", Linnovation, Inc. (12 pages).

(56) References Cited

OTHER PUBLICATIONS

McCallum, M., et al., "Alternating PSM Mask Performance—a Study of Multiple Fabrication Technique Results", International SEMATECII (6 pages).
Morikawa. Y., et al., "100nm-alt.PSM Structure Discussion for ArF Lithography", Dai-Nippon Printing Co., Ltd. (15 pages).
Ozaki, T., et al., "A 0.15um KrF Lithography for 1Gb DRAM Product Using Highly Printable Patterns and Thin Resist Process", Toshiba Corporation (2 pages).
Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencorCorp (10 pages).
Rosenbluth, A., et al., "Optimum Mask and Source Patterns to Print a Given Shape", IBM (17 pages).
Schmidt, R., et al., "Impact of Coma on CD Control for Multiphase PSM Designs", AMD, ASML (10 pages).
Sewell. H., et al., "An Evaluation of the Dual Exposure Technique", SVG Lithography Systems Inc. (11 pages).
Spence, C., et al., "Optimization of Phase-Shift Mask Designs Including Defocus Effects", AMD, Princeton University, Vecor Technologies Inc. (8 pages).
Suzuki, A., et al., "Multilevel Imaging System Realizing k1=.3 Lithogrpahy". Canon Inc. (13 pages).
Vandenberghe, G., et al., "(Sub-)100nm Gate Patterning Using 248nm Alternating PSM", IMEC. Mentor Graphics (9 pages).
Fritze, M., et al., "100-nm Node Lithography with KrF.", MIT Lincoln Lab, Numberical Technologies, Photronics, Arch Chemicals (14 pages).
Fukuda, II., et al., "Patterning of Random Interconnect Using Double Exposure of Strong-Type PSMs", Hrachi Central Research Lab (8 pages).
Ferguson, R., et al., "Pattern-Dependent Correction of Mask Topography Effects for Alternating Phase-Shifting Masks", IBM Microelectronics, University of California Berkeley (12 pages).
Toublan, O., et al., "Phase and Transmission Errors Aware OPC Solution for PSM: Feasibility Demonstration", Mentor Graphics Corp. (7 pages).
Yanagishita, Y., et al., "Phase-Shifting Photolithography Applicable to Real IC Patterns", Fujitsu Limited (11 pages).
Levenson, M., et al., "Improving Resolution in Photolithography with a Phase-Shifting Mask", IEEE, Transactions On Electron Devices, vol. ED-29, No. 12, pp. 1828-1836, Dec. 1982.
Levenson. M., et al., "The Phase-Shifting Mask II: Imaging Simulations and Submicrometer Resist Exposures", IEEE Transactions on Electron Devices, vol. ED-31. No. 6, pp. 753-763, Jun. 1984.
Terasawa, T., et al., "0.3-Micron Optical Lithography Using a Phase-Shifting Mask", SPIE, Optical/Laser Microlithography II, vol. 1088, pp. 25-33, Mar. 1989.
Nitayama, A., et al., "New Phase Shifting Mask with Self-Aligned Phase Sifters for a Quarter Micron Photolithography", IEDM, pp. 3.3.1-3.3.4, Dec. 3-6, 1989.
Jinbo, H., et al., "0.2um or Less i-Line Lithography by Phase-Shifting-Mask Technology", IEEE, pp. 33.3.1-33.3.4 (1990).
Neureuther, A., "Modeling Phase Shifting Masks", SPIE, 10th Annual Symposium on Microlithography, vol. 1496, pp. 80-85 (1990).
Yamanaka, T., et al., "A 5.9um2 Super Low Power SRAM Cell Using a New Phase-Shift Lithography", IEDM, pp. 18.3.1-18.3.4 (1990).
Inokuchi K., et al., "Sub-Quarter Micron Gate Fabrication Process Using Phase-Shifting-Mask for Microwave GaAs Devices", Extended Abstracts of The 1991 Intl. Conferences on Solid State Devices and Materials, Yokohama, Japan. pp. 92-94 (1991).
Inokuchi, K. et al., "Sub-Quarter-Micron Gate Fabrication Process Using Phase-Shifting Mask for Microwave GaAs Devices", Japanese Journal of Applied Physics, vol. 30, No. 12B, pp. 3818-3821, Dec. 1991.
Jinbo, H., et al., "Improvement of Phase-Shifter Edge Line Mask Method", Japanese Journal of Applied Physics, vol. 10, No. 11B, pp. 2998-3003, Nov. 1991.
Kimura, T., et al., "Subhalf-Micron Gate GaAs Mesfet Process Using Phase-Shifting-Mask Technology", IEEE, GaAs IC Symposium, pp. 281-284 (1991).
Wiley, J., et al., "Phase Shift Mask Pattern Accuracy Requirements and Inspection Technology", SPIE., Integrated Circuit Metrology, Inspection, And Process Control V, vol. 1464, pp. 346-355 (1991).
Hirai, Y., et al., "Automatic Pattern Generation System for Phase Shifting Mask", 1991 Symposium on VLSI Technology, Digest of Technical Papers, pp. 95-96, May 28-30, 1991.
Wong, A., et al, "Investigating Phase-Shifting Mask Layout Issues Using a Cad Toolkit", IEEE, pp. 27.4.1-27.4.4 (1991).
Terasawa, T., et al., "Imaging Characteristics of Multi-Phase-Shifting and Halftone Phase-Shifting Masks", Japanese Journal of Applied Physics, vol. 30, No. 118, pp. 2991-2997, Nov. 1991.
Burggraaf, P., "Four More Significant Japanese Advances in Phase Shifting Technology", Semiconductor International, p. 16, Dec. 1991.
Kemp, K., et al., "Optimized Phase Shift Mask Designs for Real Devices", KTI Microlithography Seminar, pp. 67-75, Oct. 14-15, 1991.
Newmark, D., et al., "Phase-Shifting Mask Design Tool", SPIE—11th Annual BACUS Symposium on Photmask Technology, vol. 1604, pp. 226-235, Sep. 25-27, 1991.
Nolscher, C., et al., "Investigation of Self-Aligned Phase-Shifting Reticles by Simulation Techniques", SPIE—Optical/Laser Microlithography IV. vol. 1463, pp. 135-150 (1991).
Inoue, S., et al., "Simulation Study on Phase-Shifting Masks for Isolated Patterns", Japanese Journal of Applied Physics, vol. 30, No. 11B, pp. 3010-3015, Nov. 1991.
Watanabe. H., et al., "Detection and Printability of Shifter Defects in Phase-Shifting Masks", Japanese Journal of Applied Physics, vol. 30, No. 11B, pp. 3016-3020, Nov. 1991.
Watanabe, H., et al., "Pattern Transfer Characteristics of Transparent Phase Shifting Mask", Japanese Journal of Applied Physics, vol. 30, No. 11B, pp. 3004-3009, Nov. 1991.
Jinbo, H., et al., "Application of Blind Method to Phase-Shifting Lithography", IEEE, 1992 Symposium on VLSI Technology Digest of Technical Papers, pp. 112-113 (1992).
Watanabe, H., et al., "Detection and Primability of Shifter Defects in Phase-Shifting Masks II Defocus Characteristics", Jpn. J. Appl. Phys., vol. 31, pp. 4155-4160 (1992).
Pierrat, C., et al., "Phase-Shifting Mask Topography Effects on Lithographic Image Quality", IEEE, pp. 3.1.1-3.3.4 (1992).
Burggraaf, P., "Lithography's Leading Edge, Part I: Phase-Shift Technology and Part 2: I-Line and Beyond", Semiconductor International, pp. 43-47 and 52-56, Feb. 1992.
IBM, "Phase-Shift Mask Utilizing Silicon Oxy-Nitride as a Low Reflectivity Phase-Shift Layer", IBM Technical Disclosure Bulletin, vol. 34, No. 10B, pp. 360-361, Mar. 1992.
Brunner, T., et al., "170nm Gates Fabricated by Phase-Shift Mask and Top Anti-Reflector Process", SPIE, Optical/Laser Microlithography VI. Vo. 1927, pp. 182-189 (1993).
Haratuji, K., et al., "A Novel Hierarchical Approach for Proximity Effect Correction in Electron Beam Lithography", IEEE. vol. 12, No. 10, pp. 1508-1514, Oct. 1993.
Lin, B.J., "Phase-Shifting Masks Gain an Edge", IEEE Circuits & Devices, pp. 28-35, Mar. 1993.
Rieger, M., et al., "System for Lithography Proximity Compensation", Precim Company, Portland, Oregon, Sep. 1993 (28 pages).
Moniwa, A., et al., "Algorithm for Phase-Shift Mask Design with Priority on Shifter Placement", Jpn. J. Appl. Phys., vol. 32, Pt. I, No. 12B, pp. 5874-5879, Dec. 1193.
Ooi, K., et al., "Computer Aided Design Software for Designing Phase-Shifting Masks", Jpn. J. Appl. Phys., vol. 32, Pt. I, No. 12B, pp. 5887-5891, Dec. 1993.
Ohtsuka, H., et al., "Evaluation of Repair Phase and Size Tolerance for a Phase-Shift Mask", J. Vac. Sci. Technol. B, vol. 11. No. 6, pp. 2665-2668, Nov./Dec. 1993.
Ronse, K., et al., "Comparison of Various Phase Shift Strategies and Application to 0.35um ASIC Designs", SPIE—Optical/Laser Microlithography VI, vol. 1927, pp. 2-16 (1993).

(56) References Cited

OTHER PUBLICATIONS

Galan, G., et al., "Application of Alternating-Type Phase Shift Mask, to Polysilicon Level for Random Logic Circuits", Jpn. J. Appl. Phys., vol. 33, pp. 6779-6784 (1994).
Mizuno, F., et al., "Practical Phase-Shifting Mask Technology for 0.3um Large Scale Intergrations", J. Vac. Technol. B, vol. 12, No. 6, pp. 3799-3803. Nov./Dec. 1994.
Pati, Y.C., et al., "Phase-Shifting Mask for Microlithography: Automated Design and Mask Requirements", J Opt. Soc. Am., vol. 11, No. 9, pp. 2438-2452, Sep. 1994.
Stirniman, J., et al., "Wafer Proximity Correction and Its Impact on Mask-Making", Bacus News, vol. 10, Issue I, pp. 1, 3-7, Jan. 10-12, 1994.
Waas, T., et al., "Automatic Generation of Phase Shift Mask Layouts", Microelectronic Engineering, vol. 23, pp. 139-142 (1994).
Barouch, E., et al., "OPTIMASK: An OPC Algorithm for Chrome and Phase-Shift Mask Design", SPIE, Vo. 2440, pp. 192-206, Feb. 1995.
Moniwa, A., et al., "Heuristic Method for Phase-Conflict Minimization in Automatic Phase-Shift Mask Design", Jpn. J. Appl. Phys., vol. 34, Pt. 1. No. 12B, pp. 6584-6589, Dec. 1995.
Langston, J., et al., "Extending Optical Lithography to 0.25um and Below", Solid State Technology, pp. 57-64, Mar. 1995.
Nagahiro, Y., "Improved Mask Technique for Photolithography Applied to 0.25um LSI—Improvement of Resolution, Pattern Correction, Exposure Area", Nikkei Microdevices, pp. 1-6, Apr. 1995.
Okamoto, Y., et al., "A New Phase Shifting Mask Technology for Quarter Micron Photolithography", SPIE, vol. 2512, pp. 311-318 (1995).
Pierrat, C., et al., "Required Optical Characteristics of Materials for Phase-Shifting Masks", Applied Optics, vol. 34, No. 22, pp. 4923-4928, Aug. 1, 1995.
Galan, G., et al., "Alternating Phase Shift Generation for Coplex Circuit Designs", SPIE, vol. 2884, pp. 508-519, Sep. 18-20, 1996.
Kanai, H., et al., "Sub-Quarter Micron Lithography with the Dual-Trench Type Alternating PSM", SPIE, vol. 2793, pp. 165-173 (1996).
Ishiwata, N., et al., "Novel Alternating Phase Shift Mask with Improved Phase Accuracy", SPIE. Proceedings of The 17th Annual Symposium on Photomask Technology and Management, vol. 3236, pp. 243-249 (1997).
Murimoto, H., et al., "Next Generation Mask Strategy—Technologies are Ready for Mass Production of 256MDRAM?", SPIE, vol. 3236, pp. 188-189 (1997).
Roman, B., et al., "Implications of Device Processing on Photomask CD Requirements", SPIE, vol. 3236 (1997) (Abstract Only).
Nakae, A., et al., "A Proposal for Pattern Layout Rule in Application of Alternating Phase Shift Mask", SPIE, vol. 3096, pp. 362-374 (1997).

Tsujimoto, E., et al., "Hierarchical Mask Data Design System (PROPHET) for Aerial Image Simulation, Automatic Phase-Shifter Placement, and Subpeak Overlap Checking", SPIE, vol. 3096, pp. 163-172 (1997).
Yamamoto, K., et al., "Hierarchical Processing of Levenson-Type Phase Shifter Generation", Jpn. J. Appl. Phys., vol. 36, Part 1, No. 12B, pp. 7499-7503, Dec. 1997.
Gordon, R., et al., "Design and Analysis of Manufacturable Alternating Phase-Shifting Masks", Bacus News, vol. 14, Issue 12, pp. 1-9, Dec. 1998.
Nara, M., et al., "Phase Controllability Improvement for Alternating Phase Shift Mask" Dai Nippon Printing Co., Ltd. (16 pages).
Ohnuma, H., et al., "Lithography Computer Aided Design Technology for Embedded Memory in Logic", Jpn. J. Appl. Phys., vol. 37, Part I, No. 12B, pp. 6686-6688, Dec. 1998.
Fukuda, H., "Node-Connection/Quantum Phase-Shifting Mask: Path to Below 0.3um Pitch, Proximity Effect Free, Random Interconnects and Memory Patterning", J. Vac. Sci. Technol. B, vol. 17, No. 6, pp. 3291-3295, Nov./Dec. 1999.
Spence, C., et al., "Integration of Optical Proximity Correction Strategies in Strong Phase Shifters Design for Poly-Gate Layers", Bacus News, vol. 15, Issue 12, pp. 1, 4-13, Dec. 1999.
Kuo, C., et al., "Extension of Deep-Ultraviolet Lithography for Patterning Logic Gates Using Alternating Phase Shifting Masks", J. Vac. Sci. Technol. B, vol. 17, No. 6, pp. 3296-3300, Nov./Dec. 1999.
Palmer, S., et al., "Dual Mask Model-Based Proximity Correction for High Perfomance 0.10um CMOS Process", The 44th International Conference on Electron, Ion and Photon Beam Technology and Nanofabrication Abstracts, pp. 18-19, May 30-Jun. 2, 2000.
Kikuchi, K., et al., "Method of Expanding Process Window for the Noble Exposure Technique with alt-PSMs", Optical Microlithography XIII, Proceedings of SPIE, vol. 4000, pp. 121-131 (2000).
Cooke, M., "OPC/PSM Designs for Poly Gate Layers", European Semiconductor, vol. 22, No. 7, pp. 57-59, Jul. 2000.
Graaik, Y., et al., "Sub-Resolution Process Windows and Yield Estimation Technique Based on Detailed Full-Chip CD Simulation", SPIE, vol. 4182, pp. 335-341 (2001).
Plat, M., et al., "The Impact of Optical Enhancement Techniques on the Mask Error Enhancement Function (MEEF)", SPIE, vol. 4000, pp. 206-214, Mar. 1-3, 2000.
Mansuripur, M., et al., "Projection Photolithography", Optics & Photonics News 11, 17 pages, Feb. 2000.
Heng et al. "Application of Automated Design Migration to Alternating Phase Shift Mask (AltPSM) Design," ISPD, Apr. 2001, Presentation (19 pages).

* cited by examiner

HANDLING OF FLAT DATA FOR PHASE PROCESSING INCLUDING GROWING SHAPES WITHIN BINS TO IDENTIFY CLUSTERS

RELATED APPLICATIONS

This application is a divisional of U.S. patent application Ser. No. 11/083,697, entitled Handling Of Flat Data For Phase Processing Including Growing Shapes Within Bins To Identify Clusters" filed Mar. 17, 2005 which is a continuation of U.S. patent application Ser. No. 10/165,550, entitled "Design Data Format And Hierarchy Management For Processing" filed Jun. 7, 2002.

The present application is also a non-provisional or continuation-in-part of the following:

This application is related to, claims the benefit of priority of, and incorporates by reference, the U.S. Provisional Patent Application Ser. No. 60/296,788, filed Jun. 8, 2001, entitled "Phase Conflict Resolution for Photolithographic Masks", having inventors Christophe Pierrat and Michel Côté, and assigned to the assignee of the present invention.

This application is related to, claims the benefit of priority of, and incorporates by reference, the U.S. Provisional Patent Application Ser. No. 60/304,142 filed Jul. 10, 2001, entitled "Phase Conflict Resolution for Photolithographic Masks", having inventors Christophe Pierrat and Michel Côte, and assigned to the assignee of the present invention.

This application is related to, claims the benefit of priority of, and incorporates by reference, the U.S. Provisional Patent Application Ser. No. 60/325,689 filed Sep. 28, 2001, entitled "Cost Functions And Gate CD Reduction In Phase Shifting Photolithographic Masks", having inventors Christophe Pierrat and Michel Cote, and assigned to the assignee of the present invention.

This application is related to, claims the benefit of priority of, and incorporates by reference, the United States patent application Ser. No. 09/669,359 filed Sep. 26, 2000, entitled "Phase Shift Masking for Complex Patterns", having inventor Christophe Pierrat, and assigned to the assignee of the present invention, which is related to U.S. Provisional Patent Application Ser. No. 60/215,938 filed Jul. 5, 2000, entitled "Phase Shift Masking For Complex Layouts", having inventor Christophe Pierrat, and assigned to the assignee of the present invention.

This application is related to, claims the benefit of priority of, and incorporates by reference, the U.S. patent application Ser. No. 10/085,759 filed Feb. 28, 2002, entitled "Design And Layout Of Phase Shifting Photolithographic Masks", having inventors Michel Luc Côté and Christophe Pierrat, and assigned to the assignee of the present invention.

BACKGROUND OF THE INVENTION

1. Field of the Invention

The invention relates to the processing of design data and, in particular to placing phase shifting regions and assigning phase to such regions for different formats of design data.

2. Description of the Related Art

Lithography is a well-known process used in the semiconductor industry to form lines, contacts, and other known structures in integrated circuits (ICs). In conventional lithography, a mask (wherein the term "mask" as used herein can refer to a mask or a reticle) having a pattern of transparent and opaque regions representing such structures in one IC layer is illuminated. The emanating light from the mask is then focused onto a photoresist layer provided on a wafer. During a subsequent development process, portions of the photoresist layer are removed, wherein the portions are defined by the pattern. In this manner, the pattern of the mask is transferred to (i.e. printed on) the photoresist layer.

However, diffraction effects at the transition of the transparent regions to the opaque regions on the mask can render the corresponding printed edges on the wafer indistinct, thereby adversely affecting the resolution of the lithography process. Various techniques have been proposed to improve the resolution. One such technique, phase shifting, uses phase destructive interference of the waves of incident light. Specifically, phase shifting shifts the phase of a first region of incident light waves approximately 180 degrees relative to a second, adjacent region of incident light waves to create a sub-wavelength feature between the first and second regions. Thus, a feature, as defined by exposed and unexposed portions of a photoresist illuminated through a mask, can be more closely defined by using phase shifting, thereby allowing greater structure density on the IC. As the need for feature density increases, phase shifting is being applied to many features in the design data (which defines the pattern of transparent and opaque regions for the mask).

There are two common formats for design data: flattened and hierarchical. Each format has advantages and disadvantages. For example, flattened design data, e.g. layouts, are geometrical in nature and therefore adjacency between structures can easily be determined. However, flattened design data can result in an extremely large file size, e.g. 10-15 GB, for a layer. In contrast, hierarchical design data are more space efficient because multiple copies of a single geometry can be stored once and then referenced in other locations. Unfortunately, hierarchical design data are not well suited for performing geometrical operations because adjacency and position information must be computed.

The positioning of phase shifting regions (hereinafter shifters) and the assignment of phase to such shifters is a highly geometrical operation. Therefore, a need arises for a system and method of efficiently processing design data for one or both formats.

SUMMARY OF THE INVENTION

In accordance with one feature of the invention, shapes in design data, such as in a layout, can be grouped into "clusters". A cluster is a collection of one or more shapes from the layout that are sufficiently distant from other shapes that phase processing is possible without considering such other shapes, e.g. each cluster can undergo phase processing in parallel. Advantageously, the use of clusters can significantly reduce the processing time associated with the placement and phase assignment of phase shifting regions (also called shifters) for the layout.

To form the clusters, the design data can be partitioned into defined areas called bins. Then, shapes in the bins can be "grown" to build clusters. Growing the shapes can refer to extending edges of the shapes in directions perpendicular to those edges. Extending the edges forms enlarged shapes. If any enlarged shapes overlap, then the shapes associated with the overlapping enlarged shapes can be designated as a cluster.

Identical clusters in a bin (or within multiple bins) can be identified. Phase processing can be performed based on the clusters. In one embodiment, phase processing can include providing the shifters for shapes in the clusters and assigning phase to such shifters.

The edges can be "grown", or extended, by a uniform, predetermined amount. In one embodiment, the predetermined amount is approximately a shifter width plus slightly more than ½ separation, wherein the separation refers to a minimum distance required between two shifters. In one basic grow technique, all edges can be extended and 90 degree corners can be formed.

In another technique, an edge associated with a line end, called an endcap, is not extended. This technique is allowable because the endcap can be defined by an opaque area on a complementary mask. For this reason, shifters defining the endcap are not necessary. Therefore, by using the endcap technique, cluster sizes can be reduced slightly.

In another technique, a corner can be grown the predetermined amount. In one embodiment, a distance d can be measured from a 45 degree diagonal at the corner and the corner of the enlarged shape can be "clipped" at this point. In one embodiment, a line perpendicular to the diagonal can define the clipped corner of the enlarged shape. Using this diagonal corner technique, some shapes that would otherwise be placed in one cluster can be placed into different clusters.

Some embodiments of the invention can include a software tool for processing design data that includes a plurality of shapes. The software tool can include source code segments for performing some or all of the above steps. The software tool can include a source code segment that modifies the design data to include the phase information, e.g. perform phase processing.

Other embodiments of the invention can include a method for providing phase shifters in a layout and assigning phase to such phase shifters. The method can include accessing various source code segments that perform some or all of the above steps. These source code segments can include a source code segment that repartitions the bins to include shapes that previously overlapped the bin boundaries.

Other embodiments of the invention can include a system for providing phase shifters in a layout and assigning phase to such phase shifters. The system can at least include the means for filtering shapes by defined areas in the layout, the means for building clusters within the defined areas, the means for identifying identical clusters in a defined area or in multiple defined areas, the means for providing phase information for the clusters, and means for modifying the layout to include the phase information.

Yet other embodiments of the invention can include a computer data signal comprising a plurality of clusters corresponding to layout data. Each cluster can represent a plurality of shapes in the layout data. The shapes have a predetermined proximity to each other. The clusters are phase shifted independently of one another. The predetermined proximity can be determined by using at least a grow technique (wherein certain edges of each shape are extended a predetermined amount), an endcap technique (wherein a line end is not grown), or a diagonal corner technique (wherein a corner of a shape is grown the predetermined amount). In one embodiment, at least one cluster represents a plurality of merged sparse clusters.

Yet other embodiments of the invention can include a method of using clusters in electronic design automation. The method can include receiving data including a plurality of clusters, wherein each cluster represents a plurality of shapes in an original layout. The method can further include preparing a phase shifting layout for the original layout by phase shifting each of the plurality of clusters independently of one another.

Yet other embodiments of the invention can include an electronic design automation program comprising a source code segment designed to receive data in a cluster format. Each cluster represents a plurality of shapes in the layout data having a predetermined spatial relationship to each other. Of importance, the clusters are phase shifted independently of one another. The predetermined proximity can be determined by growing certain edges of each shape a predetermined amount, not growing a line end, and/or growing a corner of a shape the predetermined amount.

DETAILED DESCRIPTION OF THE FIGURES

Figure 1:
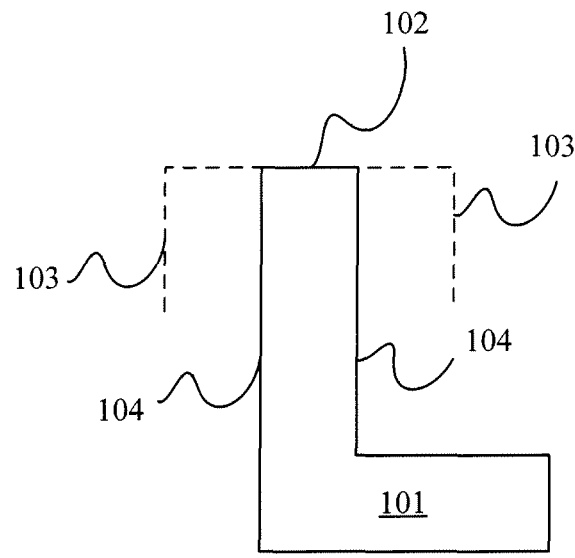
FIG. 1 illustrates growing a shape using an endcap technique.

In accordance with one feature of the invention, structures (also called shapes) in a layout can be grouped into "clusters". As used herein, a cluster is a collection of one or more shapes from the layout that are sufficiently distant (in optical and/or other types of proximity) from other shapes that phase processing is possible without considering such other shapes. The use of clusters can significantly reduce the processing time associated with the positioning and phase assignment of phase shifting regions (also called shifters) for the layout.

In accordance with one aspect of the invention, various levels of clusters can be designated. For example, in one embodiment, a set of small clusters that are close and instantiated multiple times could be grouped into a larger cluster. In another embodiment, to minimize the overhead of sending separate processes for many small clusters, these clusters could be sent as a single process. Note that such clusters do not form a larger cluster, i.e. they remain separate independent clusters to be processed. However, by sending the clusters as a single process, the time lost by sending many small jobs can be minimized. Moreover, the size of a job can be optimized for best use of a processor.

Note that there need not be a correspondence between cells and clusters. Thus, a single cell might have multiple clusters and similarly a single cluster might span multiple cells.

Advantageously, clustering can be applied to design data in either flattened or hierarchical formats after manipulation of the design data. The application of clustering to design data in each format will now be described.

Clustering Applied To Flattened Design Data

In accordance with one feature of the invention, clusters of shapes in a layout or other design data can be identified. This identification allows the parallel processing of such design data. Specifically, if a first group of shapes is identical to a second group of shapes, then only one of the two groups needs to be processed and two instances indicating the group of shapes can be created. In this manner, for this case, the time for processing of the group of shapes, such as the placement and phase assignment of shifters can be significantly reduced, i.e. halved. Further improvements in processing time can be realized if additional groups of shapes identical to the first and second groups are identified.

To identify clusters, shapes in a layout can be "grown", or extended, a predetermined amount. Growing a shape means extending each edge of a shape in a direction perpendicular to that edge. A group of enlarged shapes that overlap can be designated a cluster. In one embodiment, shapes can be grown by a shifter width (wherein the term "width" refers to the height of the shifter as measured from the polysilicon) plus slightly more than ½ separation (wherein the term "separation" refers to a minimum distance required between two shifters on a photolithographic mask used to fabricate an integrated circuit).

In one embodiment, a designated cluster includes the original shapes, not the enlarged shapes (i.e. the grow operation is merely used to determine which shapes are part of a given cluster.) In another embodiment, the enlarged shapes can be using during the phase shifting process. Specifically, the enlarged shapes can be compared to the created shifters, wherein the enlarged shapes represent the maximum boundary for the created shifters. Note that the enlarged shapes may need to be reduced to remove the ½ separation before treating them as the maximum boundary for the created shifters.

In accordance with one aspect of the invention, the basic grow operation is particularly suited for relatively small layouts and/or sparse layouts. For larger layouts, certain techniques can modify the grow operation, thereby significantly improving the use of computational and memory resources.

FIG. 1 illustrates one technique wherein a grow operation is selectively performed. Specifically, an edge 102, which forms part of an endcap for a shape 101, is not grown. Other edges of shape 101, e.g. edges 104, can be grown a predetermined amount, as shown by a dotted line 103. This endcap technique is allowable because edge 102 can be defined by an opaque area on the complementary mask used in conjunction with the phase shifting mask, wherein the opaque area would substantially conform to the boundary of shape 101. For this reason, shifters along edge 102 are not necessary. Therefore, by using the endcap technique, cluster sizes can be reduced.

Figure 2B:
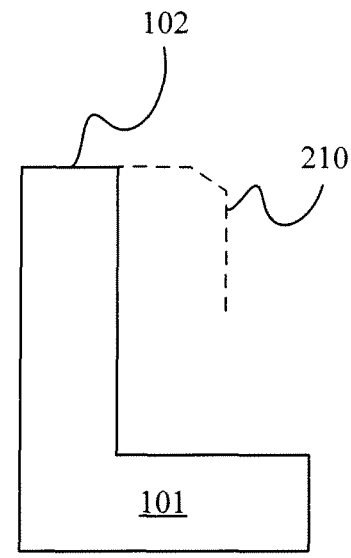
FIG. 2B illustrates growing a shape using a combination endcap/diagonal corner technique.
Figure 2A:
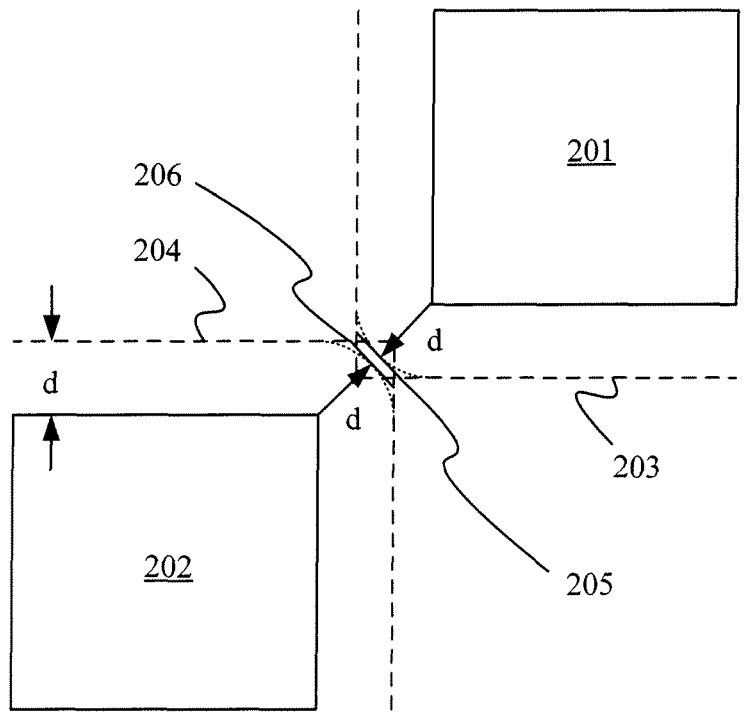
FIG. 2A illustrates growing a shape using a basic grow technique as well as a diagonal corner technique.

FIG. 2A illustrates another technique wherein the predetermined growth amount can be applied substantially equally to corners as well as to edges of the shape. For example, in FIG. 2A, two shapes 201 and 202 have been grown a predetermined amount as indicated by dotted lines 203 and 204, respectively. Note that by using a basic grow technique, which assumes a simple 90 degree corner, shapes 201 and 202 would be grouped into the same cluster (i.e. the enlarged shapes, indicated by dotted lines 203 and 204, overlap).

However, if the edges of shapes 201 and 202 are grown a distance d, then the corners are actually grown a distance d', wherein d' is substantially equal to d*sqrt(2). This increased distance d' reflects a conservative approach to cluster inclusion.

A more aggressive approach applies distance d (i.e. the predetermined amount) to the corners as well as to the edges of the shape. Specifically, in one embodiment, distance d can be measured from a 45 degree diagonal at the corners and the corners of the enlarged shapes can be "clipped" at this point. In one embodiment, a line perpendicular to the diagonal can define the clipped corner of the enlarged shape. For example, lines 205 and 206 can define clipped corners for enlarged shapes 201 and 202, respectively. Note that the corners could be curved, as indicated by the dotted lines; however, this calculation can be significantly more complex and provides substantially the same solution as clipping the corner. Therefore, in one embodiment, the clipped corners can be used, thereby simplifying computation yet providing accurate results. Note that when the predetermined amount, i.e. distance d, is applied to the corners as well as to the edges, shapes 201 and 202 can be placed into different clusters.

Balancing cluster size with efficiency is one aspect of the invention. In other words, processing only a few clusters in the layout (i.e. having mega-clusters) can be as time consuming as processing the layout without clusters. Therefore, using techniques to delineate the appropriate cluster size, e.g. the endcap and diagonal corner techniques, can advantageously provide the appropriate balance between size and efficiency. Specifically, to minimize processing time and ensure minimum data size, the smallest number of clusters that repeat themselves as often as possible can be used. To further minimize processing time, small clusters could either be grouped with other neighboring clusters, if these groups repeat themselves, or could be submitted together but still considered independent clusters. Thus, an appropriate cluster size can be determined or an appropriate number of small clusters can be determined to optimize system performance.

In one embodiment, the basic grow, endcap, and diagonal corner techniques can be applied to the same design data. Additionally, the endcap and the diagonal corner techniques could be combined. For example, referring to FIG. 2B, boundary 103 could be grown diagonally as well, thereby creating an extension 210, which is shown in FIG. 2B. This helps further reduce cluster sizes by keeping features that can be phase shifted independent of one another in separate clusters.

Parallel Processing of Flattened Design Data

Figure 3:
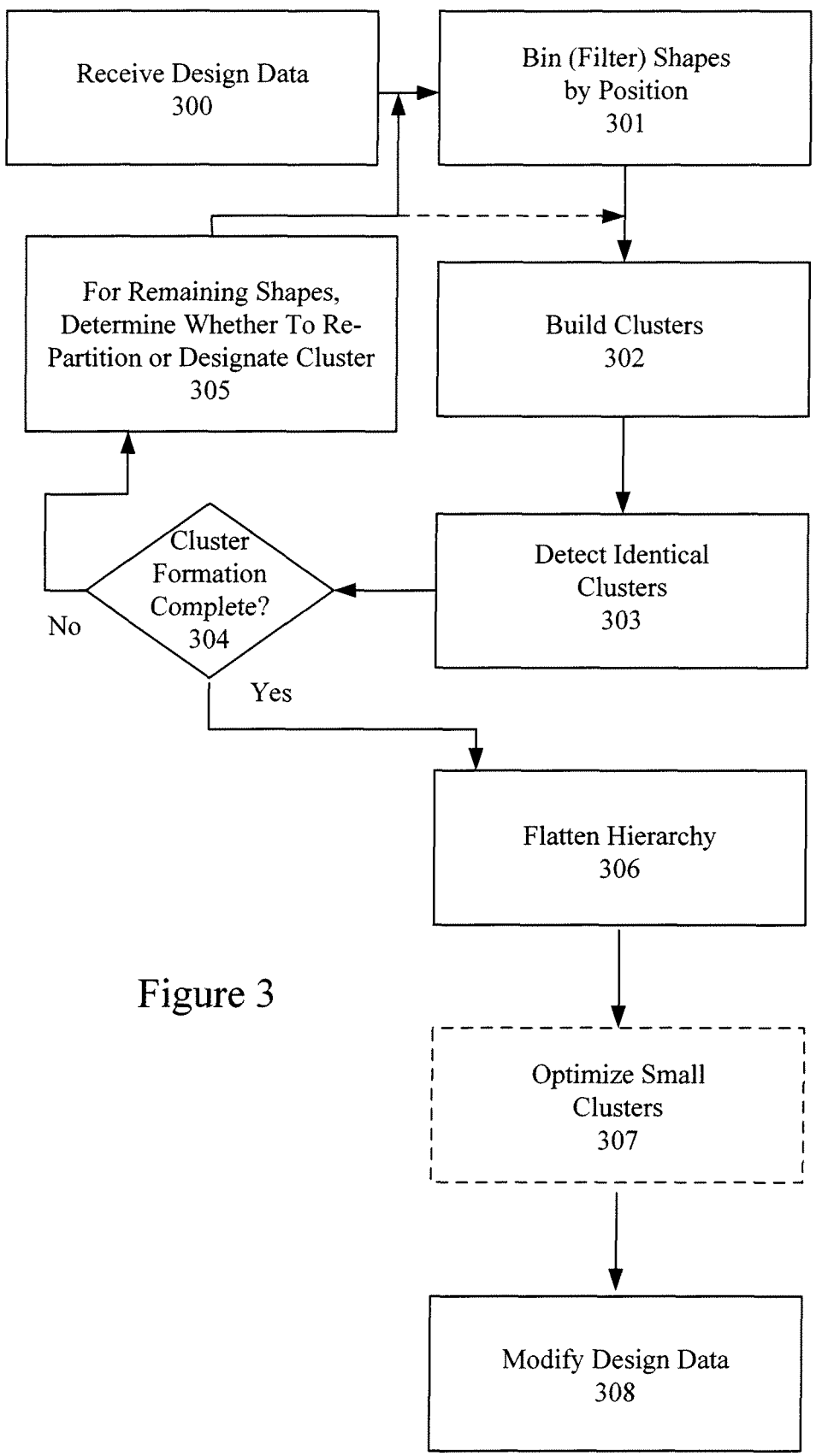
FIG. 3 illustrates a technique that can efficiently filter shapes, thereby facilitating parallel processing of design data.
Figure 4:
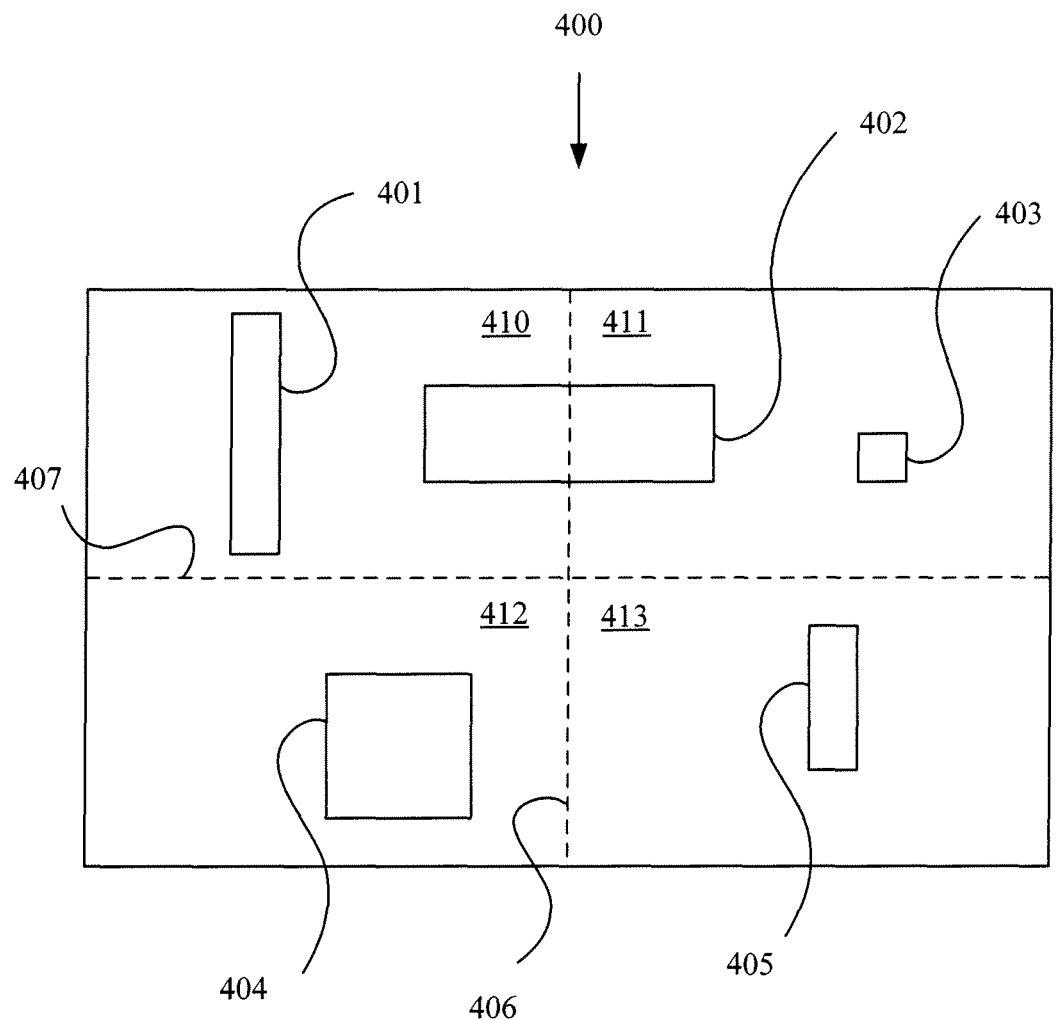
FIG. 4 illustrates a sample layout partitioned into rectangular bins, thereby facilitating dividing shapes of the layout into clusters.

In one exemplary process shown in FIG. 3, clusters in different areas of the layout can be prepared for parallel processing. In step 300 of this process, design data is received. In step 301, shapes can be binned (i.e. filtered) by position within the layout. FIG. 4 illustrates a sample layout 400 that includes a plurality of shapes 401-405. To facilitate parallel processing, layout 400 can be partitioned into rectangular bins 410-413 (wherein dashed lines 406 and 407 indicate the boundaries of bins 410-413). In layout 400, bin 410 includes shape 401 and a portion of shape 402, bin 411 includes shape 403 and a portion of shape 402, bin 412 includes a shape 404, and bin 413 includes a shape 405. In one embodiment, the number of bins selected for any layout is a power of 2. In another embodiment, the number of bins can be based on the number of processors available for performing the filtering. In yet another embodiment, the number of bins can be based on system performance, wherein the total number of shapes in the design data can be divided by an optimal number of shapes per bin, thereby resulting in number of bins. In one embodiment, an optimal number of shapes per bin can be approximately 500,000 shapes. In another embodiment, an optimal number of shapes per bin can be based on the number of shapes that a given CPU can handle for best throughput.

Various methods can be used to designate specific bins. In one embodiment, a bin can be designated by four values (X1, X2, Y1, Y2), wherein X1 and X2 are locations on an x-axis and Y1 and Y2 are locations on a y-axis. Thus, a portion of a shape is in a bin if its (x, y) position of the shape is such that $X1 < x \leq X2$ and $Y1 < y \leq Y2$. Note that the (x, y) position can designate the center of the shape, a particular corner of the shape, and/or any other readily computable position on the shape. In one embodiment, multiple (x, y) positions can be analyzed to determine whether a shape in its entirety is within a bin.

After the bins are defined and designated, clusters can be built within each bin in step 302. Building clusters can be done using the grow processes described above, including but not limited to the basic grow technique, the endcap technique, and the diagonal corner technique. In one embodiment, the bins can be processed in parallel, thereby speeding up cluster identification.

In step 303, identical clusters can be detected, thereby minimizing run time and reducing data size. For example, if the design data includes a number of repeating shapes, then some clusters may have the same shapes. Whether and how this step is performed represents a tradeoff between speed and memory consumption. Specifically, detecting identical clusters may take longer during clustering, but may save time later during phase assignment. Advantageously, detecting identical clusters can also reduce memory consumption. Specifically, the database for processed information can store placement/coloring of shifters for a cluster and indicate other instances of identical clusters.

In one embodiment, detecting identical clusters can be performed within bins. In another embodiment, detecting identical clusters can be performed across bins (i.e. to find identical clusters in other bins).

In one embodiment, identical clusters can be identified by comparing a bounding box of the expanded shape size (or original shape), the number of shapes within the cluster, and the number of vertices of each shape. After a rudimentary match is found using these parameters, other more detailed identification means can be used to ensure an actual match has been made. Note that performing phase shifter definition and phase assignment could be done after steps 302 or 303 (wherein if phase shifting is done after step 302, then any future clusters can only be sent if they do not match an already existing cluster).

In another embodiment, detection of identical clusters can occur in a distributed fashion during the processing to place shifters and assign phase. In such an embodiment, a checksum or other count can be computed as processing begins for each cluster. By comparing the checksums against a record of checksums of previously processed clusters, likely identical clusters can be identified. Further checks can be performed to verify that the current cluster is identical to the previous cluster before marking the two as identical. In one embodiment, the detection of identical clusters in this fashion makes use of the apparatuses and methods described in U.S. patent application Ser. No. 10/098,713 entitled "Method and Apparatus for Identifying an Identical Cell in an IC Layout with an Existing Solution", filed on Mar. 15, 2002, and assigned to the assignee of the present invention.

Step 304 determines whether cluster formation is complete, i.e. whether all shapes in the original layout have been placed in clusters. In one embodiment, shapes that are touching or crossing a bin boundary, such as shape 402, will not be included in a cluster. In other words, if a shape is touching or crossing a bin boundary, then this shape is not analyzed solely within the context of one bin. Therefore, such shapes can be returned to a new layout where they can be further processed. In one embodiment, the new layout can include any shapes not clustered as well as the shapes touching a bin boundary (both referenced herein as remaining shapes). Step 305 determines the processing for these remaining shapes. In one embodiment, the remaining shapes can be re-partitioned using different boundaries, i.e. the process returns to step 301. In another embodiment, the remaining shapes can be sent directly into cluster designation, i.e. the process returns to step 302.

The further processing of the remaining shapes can be based on the number of remaining shapes after step 303. In one embodiment, if the number of remaining shapes is equal to or less than a predetermined small number, then the process can proceed from step 305 to step 302 for clustering. Otherwise, the process can proceed from step 305 to step 301 for re-partitioning. In another embodiment, re-partitioning is performed as long as the number of remaining shapes decreases after step 303. If cluster formation is complete, as determined in step 304, then a hierarchy can be created from these clusters.

Figure 5:
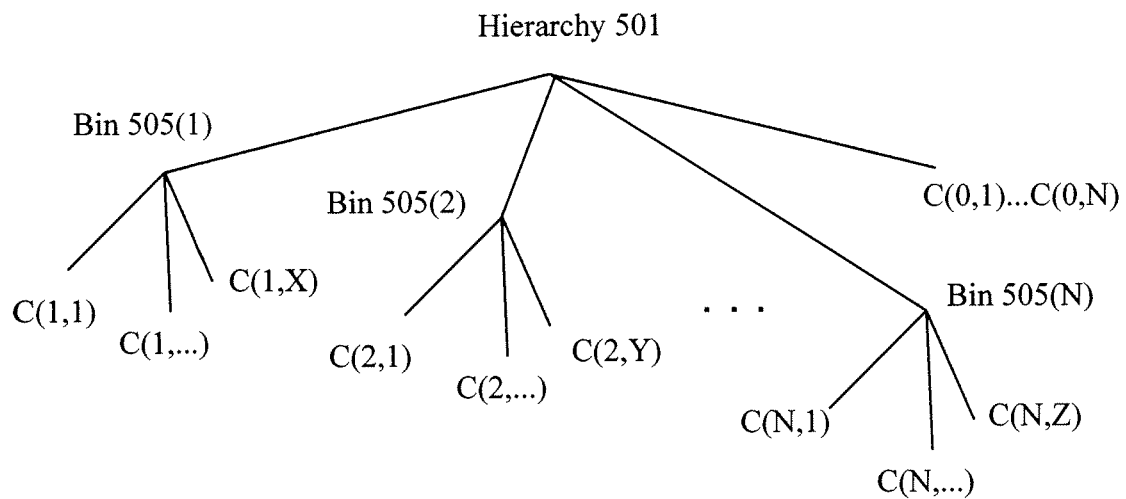
FIG. 5 illustrates one exemplary hierarchy including bin nodes at a first level and clusters at a second level.

FIG. 5 illustrates one exemplary hierarchy 501 including bin nodes 505(1)-505(N) at a first level and clusters C at a second level. The clusters are written in a notation of C(j,k), wherein j is the bin number and k is the cluster number within that bin. Thus, for example, bin 505(1) includes clusters C(1, 1)-C(1,X), bin 505(2) includes clusters C(2,1)-C(2,Y), and bin 505(N) includes clusters C(N,1)-C(N,Z).

The remaining shapes that touch/cross the bin boundaries or that were clustered by step 302 directly from step 304 can be designated at the first level in hierarchy 501, either collectively or individually. In other words, when these remaining shapes are provided to step 302, they can be stored in new bins or as individual clusters directly under the top level. For purposes of illustration in FIG. 5, these remaining shapes are designated as individual clusters C(0,1) . . . C(0,N).

Figure 6:
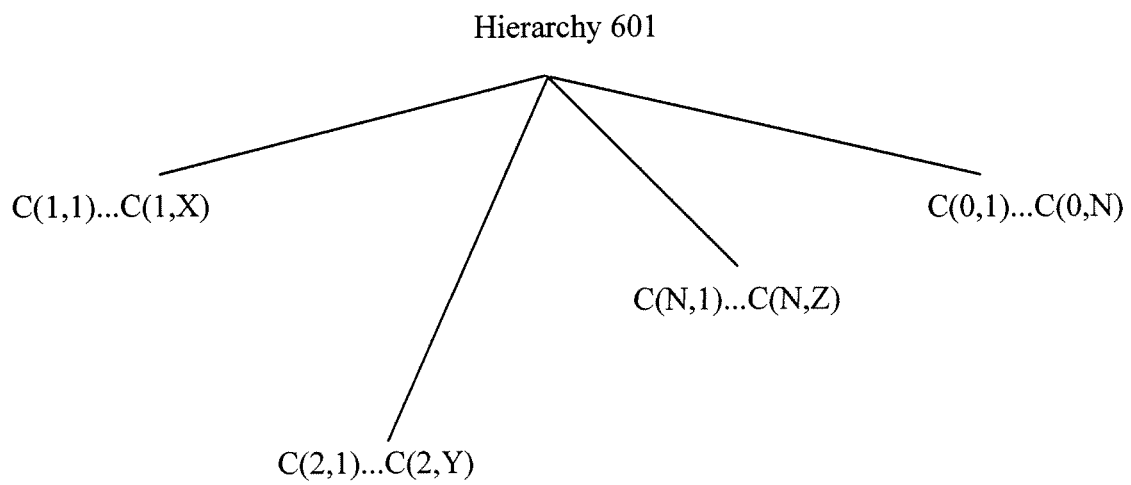
FIG. 6 illustrates a plurality of clusters that have been binned and flattened.

In step 305, the hierarchy can be flattened to remove the bins in the first layer. FIG. 6 illustrates hierarchy 501 after flattening, thereby elevating the clusters to the first level in a modified hierarchy 601. In modified hierarchy 601, clusters are provided in the first level. In accordance with one feature of the invention, returned shapes 602 and 603 can be processed, i.e. phase shifted and assigned phase, separately from the designated clusters in hierarchy 601.

In one embodiment, additional optimizations can be performed in optional step 307. For example, sparse clusters, e.g. those clusters having a relatively small number of shapes therein, can be merged into a single cluster. In one embodiment, this merger can precede step 306, thereby potentially reducing the number of clusters to analyze. (However, note that if two sparse clusters are combined into one cluster, then the number of instances may increase, thereby also increasing the design data size. If the number of instances would increase, then the sparse clusters can be send as separate clusters, but as a single process.) In another embodiment, clusters that exceed a certain size can be divided into smaller clusters. This division can be performed by cutting between shapes or even cutting shapes but not their associated shifters. Note that increasing the number of clusters is typically reserved for situations where the clusters are exceedingly large. In this case, increasing the number of clusters can improve phase processing.

In step 308, the design data can be modified to include the phase shifters and assign phase to such phase shifters on the clusters. The clusters allow the phase information to be applied quickly and efficiently to the flattened design data because each cluster can be processed independently (e.g. in parallel) of the other clusters.

In one embodiment, clusters are processed at step 308 using the apparatuses and methods described in U.S. patent application Ser. No. 10/085,759, filed Feb. 28, 2002, entitled "Design And Layout Of Phase Shifting Photolithographic Masks" having inventors Michel Luc Côté and Christophe Pierrat, assigned to the assignee of the present invention, and incorporated by reference herein.

Figure 7A:
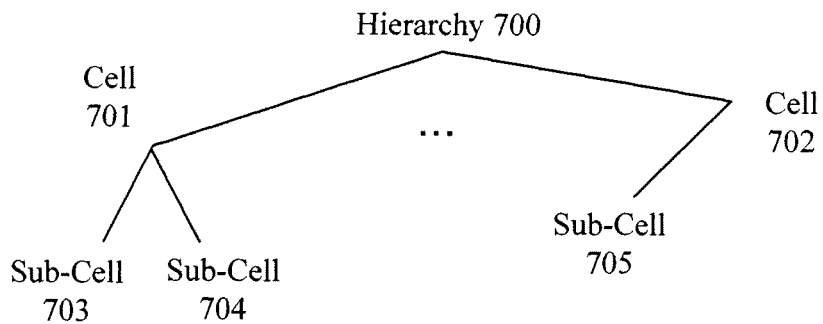
FIGS. 7A and 7B illustrate one embodiment for transforming hierarchical design data into flattened design data, thereby allowing clustering of that design data.
Figure 7B:
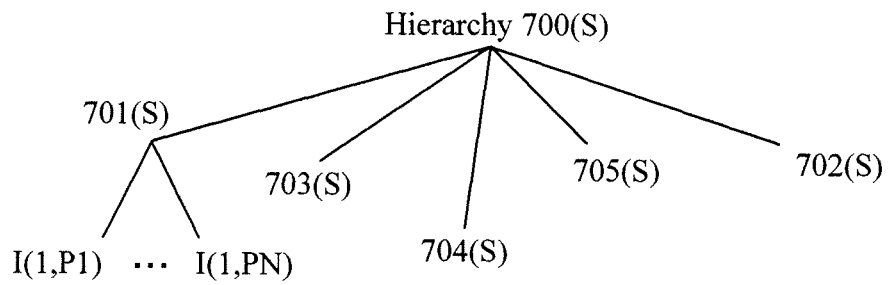

In another embodiment, clusters are processed at step 308 using the apparatuses and methods described in U.S. patent application Ser. No. 09/669,359 filed Sep. 26, 2000, entitled "Phase Shift Masking for Complex Patterns", having inventor Christophe Pierrat, assigned to the assignee of the present invention, and incorporated by reference herein. Clustering Applied To Hierarchical Design Data FIGS. 7A and 7B illustrate one embodiment for transforming hierarchical design data into clustered design data. In a standard hierarchy 700, shown in FIG. 7A, cells 701 and 702 can include one or more sub-cells. For example, cell 701 can include sub-cells 703 and 704 as well as individual shapes (not shown). In FIG. 7A, cell 702 includes a sub-cell 705. In hierarchy 700, a sub-cell refers to one or more additional cells that are provided within a cell. Like cells, a sub-cell can contain further sub-cells as well as individual shapes (not shown).

FIG. 7B illustrates hierarchy 700 after topological flattening. Specifically, in a shape hierarchy 701(S), each first level element contains its geometry. Thus, for example, cell 701 in hierarchy 700 has been replaced with element 701(S), which includes the shape information from cell 701 minus any shape information regarding sub-cells 703 and 704. Note that elements 703(S) and 704(S) now include the shape information from sub-cells 703 and 704, respectively. In a similar manner, element 702(S) includes the shape information from cell 702 minus any shape information regarding sub-cell 705. Element 705(S) includes the shape information from sub-cell 705.

In one embodiment, each first level element in hierarchy 700(S) includes references to all of the placements of that geometry (called instances). For example, element 701(S) includes multiple instances I(1,P1) ... I(1,PN). The instances are written in a notation of I(q,r), wherein q is the instance number and r is the position of the instance in the layout. Hierarchy 700(S) can be referred to as a topological hierarchy.

At this point, the shapes of the first level elements in hierarchy 700(S) can be grown and designated as clusters as described in reference to FIGS. 1, 2A, and 2B. The handling of clusters and optimizing cluster sizes can be done in an analogous fashion to the methods described in reference to FIG. 3.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, some embodiments of the invention can include a software tool for processing design data that includes a plurality of shapes. The software tool can include source code segments embodied on a physical medium, e.g. a CD-ROM, for performing some or all of the steps described in reference to FIG. 3.

Other embodiments of the invention can include a method for providing phase shifters in a layout and assigning phase to such phase shifters. The method can include accessing various source code segments. These source code segments can include a source code segment that repartitions the bins to generate additional clusters.

Other embodiments of the invention can include a system for providing phase shifters in a layout and assigning phase to such phase shifters. The system can at least include the means for filtering shapes by defined areas in the layout, the means for building clusters within the defined areas, the means for identifying identical clusters in a defined area or in multiple defined areas, the means for providing phase information for the clusters, and means for modifying the layout to include the phase information.

Note that in one embodiment, an endcap technique, instead of not growing the edge, can include growing the edge an amount different from the predetermined amount, e.g. a different positive amount or a negative amount.

In yet another embodiment, the grow techniques to identify clusters can be used to construct a trim mask. For example, a logic OR operation can be performed with the original layout and the phase shifter layout (as provided by the modified design data, see FIG. 3). A slight sizing down of the second result can provide an appropriate trim layout for the trim mask. Equation 1 illustrates this computation.

$P$=original layout $S1$=0 degree phase shifters $S2$=180 degree phase shifters $L1$=P OR S1 OR S2

$L2$=size(L1, r)

$L3$=L2 OR P       Equation 1 where r is a sizing amount (e.g. −20 nm for a sample process) and "OR" is a logical OR operation on a design. Thus, L3 is the final trim although there may be some additional clean ups to remove small features and/or gaps.

The system and methods described herein can be applied to any lithographic process technology, including ultraviolet, deep ultraviolet (DUV), extreme ultraviolet (EUV), x-ray, electron projection lithography (EPL), and ebeam. Accordingly, it is intended that the scope of the invention be defined by the following Claims and their equivalents.

The invention claimed is:

1. A computer-readable storage device including code segments, to be executed by a computer, configured to generate design data defining a pattern of transparent and opaque regions of a photolithographic mask that is utilized in a lithographic process technology to fabricate an integrated circuit, the computer-readable storage device comprising:
   a code segment for receiving a plurality of clusters corresponding to layout data related to said integrated circuit, wherein each cluster represents a plurality of shapes in the layout data, the plurality of shapes having a proximity to each other determined by a grow operation; and
   a code segment for phase shifting the plurality of clusters independently of one another,
   wherein said phase shifted plurality of clusters are operably stored in the design data such that, when said photolithographic mask is generated in accordance with said design data, said pattern of transparent and opaque regions include said phase shifted plurality of clusters.

2. The computer-readable storage device of claim 1, wherein at least one cluster represents a plurality of merged sparse clusters.

3. The computer-readable storage device of claim 1,
   wherein said code segment receives a plurality of bins, each bin including a plurality of said clusters, and
   wherein shapes touching or crossing bin boundaries are designated at a first level in a hierarchy, the plurality of bins being at the first level and the plurality of clusters being at a second level.

4. The computer-readable storage device of claim 3, further including code for elevating all clusters to the first level.

5. A method of using clusters in electronic design automation to generate modified design data defining a pattern of transparent and opaque regions of a photolithographic mask utilized to fabricate an integrated circuit, the method comprising:

receiving original design data for plurality of clusters defining said integrated circuit, each cluster representing a plurality of shapes in an original layout of said integrated circuit, the plurality of shapes having a proximity to each other determined by a grow operation;

using a computer, preparing a phase shifting layout for the original layout by phase shifting each of the plurality of clusters independently of one another, and generating said modified design data including said phase shifted plurality of clusters such that, when said photolithographic mask is generated in accordance with said modified design data, said pattern of transparent and opaque regions include said phase shifted plurality of clusters.

6. The method of claim 5, wherein the grow operation grows certain edges of each shape a predetermined amount.

7. The method of claim 6, wherein the predetermined amount is approximately a shifter width plus ½ separation, wherein the shifter width refers to a height of a shifter, and wherein the separation refers to a minimum distance required between two shifters.

8. The method of claim 5, further including preparing a trim layout corresponding to the phase shifting layout.

9. The method of claim 8, wherein preparing a trim layout includes:
performing a first logic OR operation on the original layout and the phase shifter layout to provide a first result;
slightly sizing down the first result to produce a second result; and
performing a second logic OR operation on the second result and the original layout to provide a third result.

10. The method of claim 5, wherein at least one cluster includes a plurality of sparse clusters.

11. An electronic design automation program to be executed by a computer and stored on a non-transient computer-readable medium, the electronic design automation program configured to convert original design data including layout data into modified design data defining a pattern of transparent and opaque regions of a photolithographic mask that is utilized to fabricate an integrated circuit, the electronic design automation program comprising:

a source code segment designed to receive said layout data in a bin and cluster format, wherein at least one bin includes a plurality of clusters, each cluster representing a plurality of shapes in the layout data having a predetermined spatial relationship to each other as determined by a grow operation;

a source code segment designed to phase shift the plurality of clusters independently of one another, and a modify design data segment configured to generate said modified design data including said phase shifted plurality of clusters such that, when said photolithographic mask is generated in accordance with said modified design data, said pattern of transparent and opaque regions include said phase shifted plurality of clusters.

12. The electronic design automation program of claim 11, wherein the predetermined spatial relationship is determined by at least one of:
growing certain edges of each shape a predetermined amount;
not growing a line end; and
growing a corner of a shape the predetermined amount.

13. The electronic design automation program of claim 11, wherein the grow operation includes extending certain edges of a shape a predetermined amount.

14. The electronic design automation program of claim 13, wherein the predetermined amount is approximately a shifter width plus ½separation,
wherein the shifter width refers to a height of a shifter, and wherein the separation refers to a minimum distance required between two shifters.

15. The electronic design automation program of claim 11, wherein at least one cluster includes a plurality of sparse clusters.

16. The electronic design automation program of claim 11, further including a source code segment for preparing a trim layout corresponding to the phase shifting layout.

* * * * *